United States Patent
Farooq et al.

(10) Patent No.: US 9,330,946 B1
(45) Date of Patent: May 3, 2016

(54) METHOD AND STRUCTURE OF DIE STACKING USING PRE-APPLIED UNDERFILL

(71) Applicant: International Business Machines Corporation, Armonk, NY (US)

(72) Inventors: Mukta G. Farooq, Hopewell Junction, NY (US); Michael A. Gaynes, Vestal, NY (US); Katsuyuki Sakuma, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/946,904

(22) Filed: Nov. 20, 2015

(51) Int. Cl.
| H01L 21/56 | (2006.01) |
| H01L 23/544 | (2006.01) |
| H01L 21/78 | (2006.01) |
| H01L 23/29 | (2006.01) |
| H01L 23/00 | (2006.01) |
| H01L 23/31 | (2006.01) |

(52) U.S. Cl.
CPC ............ *H01L 21/563* (2013.01); *H01L 21/561* (2013.01); *H01L 21/78* (2013.01); *H01L 23/293* (2013.01); *H01L 23/3142* (2013.01); *H01L 23/544* (2013.01); *H01L 24/14* (2013.01); *H01L 2223/54426* (2013.01); *H01L 2224/13022* (2013.01); *H01L 2924/0665* (2013.01)

(58) Field of Classification Search
None
See application file for complete search history.

(56) References Cited

U.S. PATENT DOCUMENTS

| 5,542,171 A * | 8/1996 | Juskey | B29C 45/14655 |
| | | | 257/E21.504 |
| 6,083,775 A * | 7/2000 | Huang | H01L 21/565 |
| | | | 257/E21.504 |
| 6,117,708 A * | 9/2000 | Wensel | H01L 21/565 |
| | | | 257/E21.504 |
| 6,278,193 B1 * | 8/2001 | Coico | H01L 23/544 |
| | | | 257/797 |
| 6,482,675 B2 * | 11/2002 | Hsu | H01L 21/565 |
| | | | 257/E21.504 |

(Continued)

OTHER PUBLICATIONS

Anonymous, "Method for a pre-applied coating to control the edge flow of the capillary underfill in electronic packages", IPCOM000136998D Jun. 5, 2006. 4 pgs.

(Continued)

*Primary Examiner* — Scott B Geyer
(74) *Attorney, Agent, or Firm* — Cantor Colburn LLP; Jennifer Anda

(57) ABSTRACT

Structures and processes for die stacking using an opaque or translucent pre-applied underfill material generally include selectively applying a low surface tension material to at least a portion of an alignment mark surface on a die; and applying the opaque or translucent underfill material to the die surface, wherein the underfill material does not wet or adhere to the low surface tension material such that the alignment mark surface is free of underfill material.

21 Claims, 3 Drawing Sheets

(56) References Cited

U.S. PATENT DOCUMENTS

| | | | |
|---|---|---|---|
| 6,794,225 | B2 | 9/2004 | Manepalli et al. |
| 7,129,146 | B2* | 10/2006 | Hsu ............... H01L 21/563 257/E21.503 |
| 7,141,450 | B2* | 11/2006 | Pardo ............... G01B 11/27 438/107 |
| 7,146,720 | B2* | 12/2006 | Rumsey ............... H01L 23/544 174/255 |
| 7,773,220 | B2 | 8/2010 | Feger et al. |
| 7,805,835 | B2 | 10/2010 | Dai et al. |
| 7,875,503 | B2 | 1/2011 | Gokhale et al. |
| 7,927,925 | B2 | 4/2011 | Chakrapani et al. |
| 7,972,904 | B2 | 7/2011 | Fan |
| 8,963,340 | B2 | 2/2015 | Feger et al. |
| 2005/0253275 | A1* | 11/2005 | Hsu ............... H01L 21/563 257/778 |
| 2007/0099346 | A1 | 5/2007 | Farooq et al. |
| 2008/0265445 | A1 | 10/2008 | Ferger et al. |

OTHER PUBLICATIONS

Anonymous, "Method for pre-applied wafer-level photo-imageable polymer underfill", IPCOM000144794D, Jan. 6, 2007. 8 pgs.

Anonymous, "Method of wafer-level underfill for copper bump technology", IPCOM000083120D, Feb. 28, 2005. 6 pgs.

Feger et al., "The over-bump applied resin wafer-level underfill process: Process, material and reliability", Proc. IEEE 59th Electronic Components and Technology Conference (ECTC 2009), pp. 1502-1505 (2009).

Honda et al., "NCF for wafer lamination process in higher density electronic packages", Proceedings IEEE 60th Electronic Components and Technology Conference (ECTC 2010), pp. 1853-1860 (2010).

Horibe et al., "Inter Chip Fill for 3D Chip Stack", Transactions of the Japan Institute of Electronics Packaging vol. 2, No. 1, pp. 160-162 (2009).

Johnson et al., "Wafer scale packaging based on underfill applied at the wafer level for low-cost flip chip processing", Proceedings. 49th IEEE Electronic Components and Technology Conference (ECTC 1999), pp. 950-954 (1999).

Nah et al., "Wafer level underfill for area array Cu pillar flip chip packaging of ultra-low-k chips on organic substrates", Proc. IEEE 62nd Electronic Components and Technology Conference (ECTC 2012), pp. 1233-1238 (2012).

Tuan et al., "Self-patterning, pre-applied underfilling technology for stack-die packaging", Proc. IEEE 64th Electronic Components and Technology Conference (ECTC 2014), pp. 2231-2235 (2014).

* cited by examiner

METHOD AND STRUCTURE OF DIE STACKING USING PRE-APPLIED UNDERFILL

BACKGROUND

The present invention generally relates to electronics packaging, and more particularly, to pre-applied underfill dispensed on the die prior to flip chip assembly.

Flip chip assembly technology, wherein the integrated circuit (IC) chips are essentially flipped over and bonded to substrates using solderable interconnects, has seen rapid growth in semiconductor packaging in recent years. Alignment marks on the chip and the fiducial marks on the substrates are used for the fast automatic alignment between the chip and the substrate using a flip chip tool. The assembly of encapsulated flip chip circuit boards, however, remains a time consuming and expensive process. The key drivers for the demand for this technology are increased I/O connections enabling greater speed and shorter connections resulting in improved signal integrity.

In order for wafer level packaging to be successful, the flip chip tool must be able to align the IC chips (also referred to as a die) to the substrate. Normally, key features on the die and substrate are located using vision systems. These points are used as references in the alignment of the die and the substrate. Key features on the die are either fiducials or solder bumps. Key features on the substrate are either fiducials or bond pads. Two or more die may be stacked in a single package.

An IC substrate may comprise a number of layers. Some layers may comprise organic or ceramic dielectric material. Some layers may comprise conductors, such as traces, ground planes, and vias. An IC substrate may include an electronic component mounted on a surface of the substrate. The electronic component may be functionally connected to other elements of an electronic system through a hierarchy of conductors that include substrate traces, ground planes, and vias. The conductors may carry signals that are transmitted among the electronic components, such as ICs, of the system. An IC substrate may have a relatively large number of input/output ("I/O") terminals (also called "lands"), as well as a large number of power and ground terminals or lands, on a surface of the IC substrate.

The underfill material, which occupies the space between the flipped IC chip and the IC substrate, is important for reliability of the flip chip packages. Underfill material supports the electrical connections, protects them from the environment, and reduces the thermomechanical stress on the flip chip connection. The main reason for the thermal mechanical stress is the difference in coefficients of thermal expansion (CTE) between the silicon chip (2.8 ppm/C) and the organic laminate (17 ppm/C). The CTE of the underfill material is targeted to be close to the CTE of the solder interconnect which typically ranges from 22 ppm/C (low lead and lead free solders) to 28 ppm/C (high lead solders). The high modulus of elasticity (8 to 12 GPa) of the underfill material rigidly links the silicon and laminate over the entire area of the silicon and distributes the CTE mismatched thermal mechanical stress between silicon and laminate over the entire bonded area, rather than allowing the thermal mechanical stress to be concentrated at the solder joint, and cause fatigue fracture. In order to reduce this CTE mismatch, underfill materials typically contain inorganic filler, such as silica. Generally, the higher concentration of inorganic filler in the underfill material, the higher the thermal conductivity, which is desirable for high heat transfer so as to remove heat during operation of the chips.

IBM invented the OBAR (Over Bump Applied Resin) method in which pre-applied underfill on the chip for flip chip assembly eliminates the stress induced failure of the back-end-of-line (BEOL) during the flip chip assembly process. However, when the underfill having a high concentration of inorganic filler is pre-applied on the chip, the alignment between the chip bumps and the substrates pads (or pre-solder bumps on the substrate) is very difficult because the OBAR covers the alignment marks and bumps on the chip making it difficult for alignment. The underfill, having the high concentration of inorganic filler material, is opaque or translucent at the intended thickness approximating the height of the bumps (i.e., interconnect), which makes the vision systems currently utilized for alignment less practical and prone to error.

Referring now to Prior Art FIGS. 1-3, there is shown top down photomicrographs of a representative flip chip prior and subsequent to application of an OBAR underfill material at a thickness of 85 microns. In prior art FIG. 1, the representative flip chip without the OBAR underfill material coated thereon shows the alignment mark as clearly visible which can be used for automatic alignment using an automated visual alignment tooling system. In Prior Art FIGS. 2 and 3, the flip chip surface including the alignment marks are coated with OBAR underfill material at a thickness of 85 microns approximating the height of the bumps on the chip. In prior art FIG. 2, the OBAR underfill material includes relatively small particle sizes of inorganic filler material whereas in Prior Art FIG. 3, the OBAR underfill material includes relatively fine particle sizes of inorganic filler material. In both cases, the alignment mark is no longer visible making automatic alignment using an automated visual alignment tooling system impractical. In Prior Art FIG. 2, the OBAR material is translucent, thereby diffusing light to the alignment mark such that the alignment mark is not clearly visible, and in Prior Art FIG. 3, the OBAR material is opaque. In both situations, alignment of the flip chip to a substrate using an automated visual alignment tool is not feasible.

SUMMARY

The present invention discloses processes for pre-applying an opaque or translucent underfill material prior to coupling a die to a substrate and pre-applied underfill die structures In one embodiment, the processes include selectively applying a low surface tension material of less than 35 dynes/cm to at least a portion of an alignment mark surface on a die; and applying the opaque or translucent underfill material to the die surface, wherein the underfill material does not wet or adhere to the low surface tension material such that the alignment mark surface is free of underfill material.

In one embodiment, the pre-applied underfill die structure includes a wafer comprising a plurality of dies, wherein each one of the dies includes at least one alignment mark; a transparent low surface tension material of less than 35 dynes/cm deposited onto at least a portion of the at least one alignment mark; and a pre-applied underfill material deposited onto the wafer at a thickness approximating a height of the bumps on the dies so as to define the pre-applied underfill die structure.

In another embodiment, the pre-applied underfill die structure includes a wafer comprising a plurality of dies, wherein each one of the dies includes at least one alignment mark; a transparent low surface tension material deposited onto at least a portion of the at least one alignment mark; and a pre-applied underfill material deposited onto the wafer at a thickness approximating a height of the bumps on the dies, wherein the low surface tension material is selected to provide the pre-applied underfill material with a contact angle greater than 60 degrees, and wherein the at least portion of the at least one alignment mark including the transparent low surface tension material deposited thereon is free of the pre-applied underfill material Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

PRIOR ART

PRIOR ART

The detailed description explains the preferred embodiments of the invention, together with advantages and features, by way of example with reference to the drawings.

DETAILED DESCRIPTION

The present invention provides a structure and process for applying a translucent or opaque pre-applied underfill material having a high concentration of inorganic filler such that the alignment features or markings on the board and/or chip can be readily ascertained. The process and structure generally includes creating regions of low surface tension (<35 dynes/cm) on or about the alignment features or markings at the wafer level so that every chip cut therefrom includes this feature. In this manner, the regions of low surface tension are not wetted upon subsequent application of the pre-applied underfill material regardless of the level of translucency provided the particular underfill material. Thus, at least a portion of the alignment features or markings are free of underfill material and can be readily located using vision systems for correct and accurate alignment of the die to the substrate.

Figure 1:
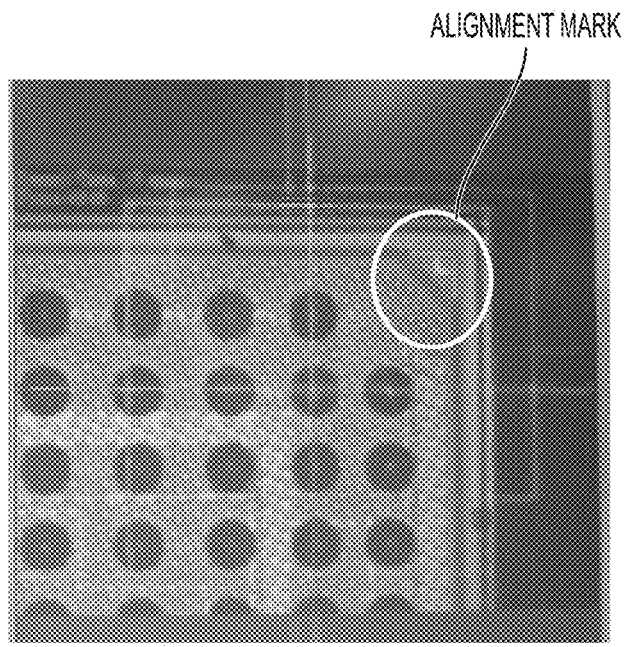
FIG. 1 illustrates a top down photomicrograph of a representative flip chip prior to application of an underfill material, wherein the alignment mark is readily visible.
Figure 2:
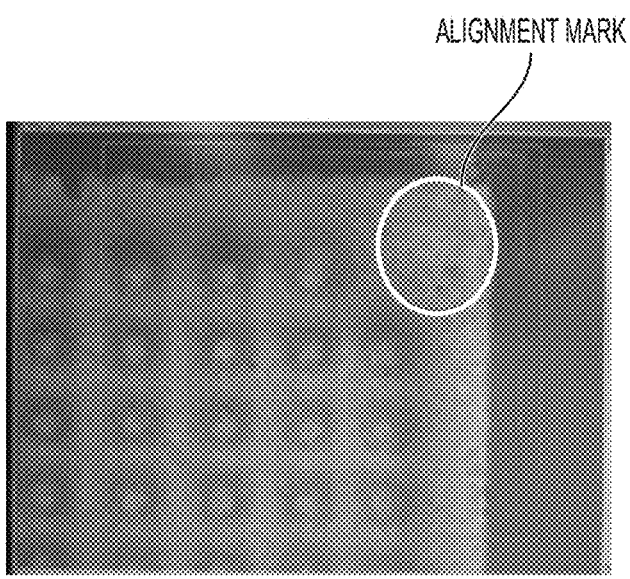
FIG. 2 illustrates a top down photomicrograph of a representative flip chip after application of an underfill material including a relatively small inorganic filler size, wherein the alignment mark is not visible; and PRIOR ART
Figure 3:
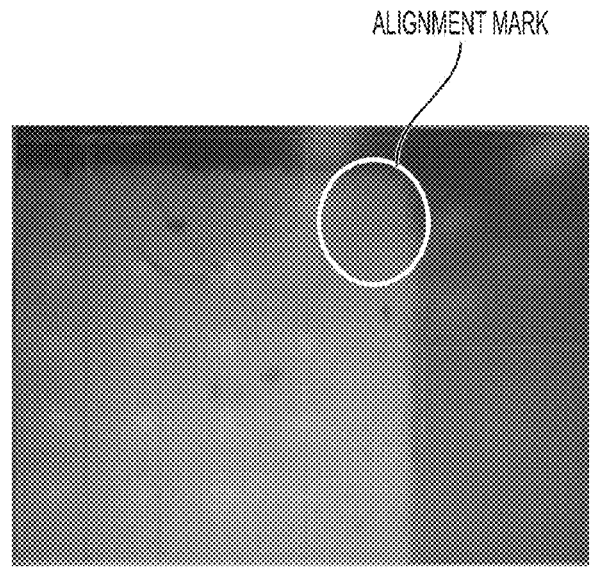
FIG. 3 illustrates a top down photomicrograph of a representative flip chip after application of an underfill material including a relatively small inorganic filler size, wherein the alignment mark and bumps are not visible.
Figure 4:
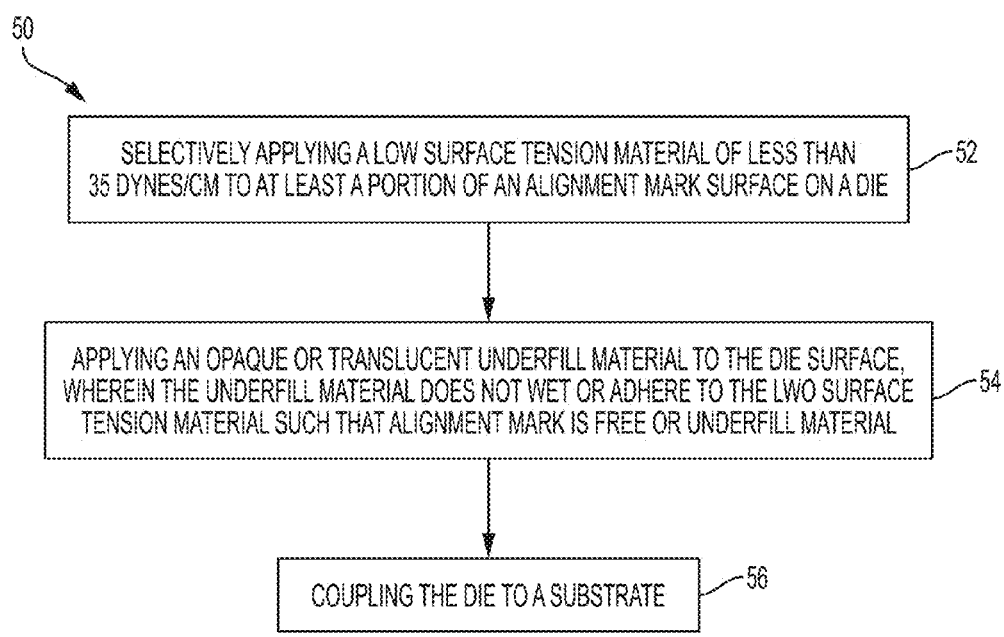
FIG. 4 is a flow diagram for pre-applying an underfill material onto a die in accordance with an embodiment of the present invention.

Referring now to FIG. 4, there is shown a flow diagram 50 for pre-applying an opaque or translucent underfill material prior to coupling a die to a substrate in accordance with an embodiment of the present invention. The process includes step 52 of selectively applying a low surface tension material of less than 35 dynes/cm to at least a portion of an alignment mark surface on a die. Step 54 includes applying the opaque or translucent underfill material to the die surface, wherein the underfill material does not wet or adhere to the low surface tension material such that the alignment mark surface is free of underfill material, and step 56 includes coupling the die to a substrate.

To understand the behavior of a surface towards liquid, its contact angle (CA) has to be measured, which will provide information on the interaction energy between the surface and the liquid. The angle at which a liquid/vapor interface converges with a solid surface is known as the contact angle. This can be measured using a contact angle goniometer. The greater the contact angle, the lower the surface tension is. The present invention is generally directed to materials with low surface tension that provide a contact angle greater than 60 degrees, with greater than 90 degrees in other embodiments. Suitable low surface tension materials are substantially inert to the materials used to fabricate the chip and do not affect bonding of the chip to the substrate.

By way of example, suitable low surface tension materials include, but are not limited to, fluoropolymers, which are generally known to provide low surface energy. Exemplary fluorinated polymers include polytetrafluoroethylene, fluorinated ethylene propylene, perflouroalkoxy, and the like. An exemplary low surface tension material that can be utilized to form the transparent low surface tension coating is a Miller Stephenson MS 122AX Teflon (polytetrafluoroethylene) spray mold release, or DuPont Teflon AF dissolved at 3 to 15% concentration in a perfluorinated solvent.

Other suitable low surface tension materials include octadecyltrichlorosilane, dodecyltrichlorosilane, octadecyltrimethoxy silane, and the like, which form a self-assembled low surface tension monolayer defined by a generally long chain alkyl group and a polar head group ($SiCl_3$-).

In one embodiment, the process for applying a translucent or opaque pre-applied underfill material having a high concentration of inorganic filler such that the alignment features or markings on the board and/or chip can be readily ascertained includes forming a metal mask with openings that match the alignment features or markings to be used by the vision system. The openings may correspond to all of the alignment features or markings or to a portion thereof such that proper alignment of the die to the substrate can be made using automated visual alignment tooling system. A coating (e.g., sprayable dry powder coating such as Miller Stephenson MX 122 AX) of the low surface tension material is then applied to the wafer via the mask through the unmasked areas (i.e., openings). The metal mask is then released from the wafer and the wafer is then baked at an elevated temperature and time to form a thin film coating.

Figure 5:
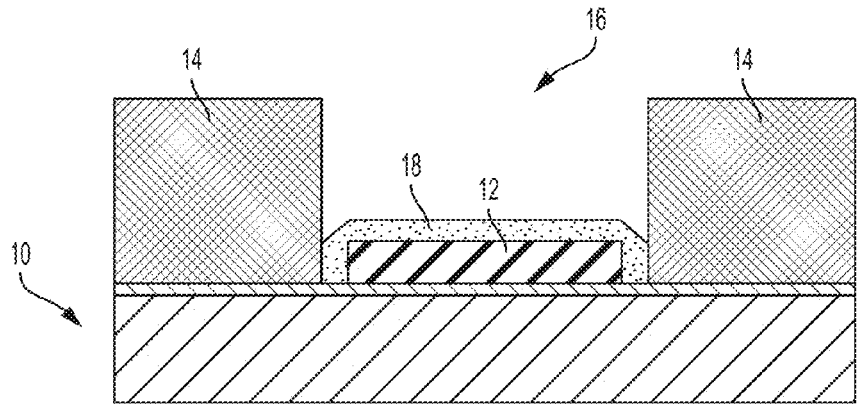
FIG. 5 schematically illustrates a cross sectional view of a contact mask on a flip chip structure including an alignment mark, wherein the contact mask includes an opening corresponding to the alignment mark.

Referring now to FIG. 5, there is schematically shown a cross section of a wafer 10 including an alignment mark 12 corresponding to a die. The metal mask 14 has an opening 16 that corresponds to the alignment mark 12. The metal mask 14 can be formed of an inert non-reactive material such as, for example, stainless steel, molybdenum, nickel and the like. A thin layer 18 of a low surface tension coating, which is transparent, is selectively applied to the alignment mark 12 and baked at an elevated temperature and time to form a stable coating. Application means is not intended to be limited and can include spraying, immersion, spin coating, or the like. By way of example, polytetrafluoroethylene can be applied on the alignment marks and heated to a temperature of 315° C. for a period of 10 minutes to effectively melt and coalesce the polytetrafluoroethylene particles and form a stable coating. The thickness of the coating is generally not intended to be limited so long as the low surface tension material is transparent. In most embodiments, the thickness of the low surface tension material is less than 100 microns; in other embodiments, less than 10 micron, and in still other embodiments, less than 5 microns. The self-assembled, few monolayer coatings will be on the order of 0.001 to 0.01 microns.

After the metal mask has been removed and the low surface tension material exposed to an elevated temperature for an intended amount of time to form a stable coating, the underfill material is applied to the wafer so that the bumps remain free of the underfill material. Because the low surface tension material covers the alignment marks, the underfill material will not adhere or wet to these regions, thereby permitting pre-application of high inorganic filler underfill materials without affecting proper alignment of the die to the substrate using automated visual alignment tooling system.

Figure 6:
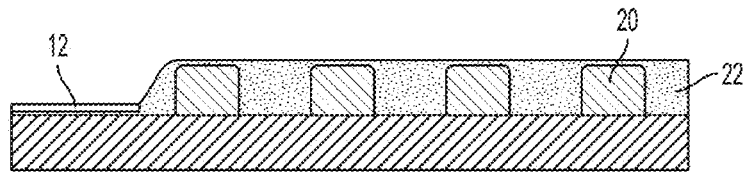
FIG. 6 schematically illustrates a cross sectional view of an pre-applied underfill die structure including a pre-applied underfill material deposited onto the wafer at a thickness approximating a height of the bumps on the dies so as to define the pre-applied underfill die structure.

As shown more clearly in FIG. 6, the pre-applied underfill material 22 is deposited onto the wafer 10 at a thickness approximating a height of the bumps 20 on the dies. As noted above, each one of the dies includes at least one alignment mark 12; a transparent low surface tension material deposited onto at least a portion of the at least one alignment mark 12; and a pre-applied underfill material 22 deposited onto the wafer 10 at a thickness approximating a height of the bumps 20 on the dies.

In the next step, the underfill material is deposited. For example, the underfill material deposited on the wafer can be "b-staged." In the art, a b-stage resin is a thermosetting resin reacted to a stage where it is hard at room temperature and essentially solvent free but still flows when heated above its b-stage Tg. It is a preferred stage for a resin when it is being molded. In the step where the wafer is b-staged, the solvent is removed and the crosslink reaction is advanced to significantly below the gel point with the goal to render the b-staged underfill surface generally tack free and to impart desired b-stage Tg and flow properties.

In the next step, the wafer is diced into underfilled chips (dies) cutting through the pre-applied underfill where it lies between components. During dicing operation, the underfill needs to stay below the Tg so as not to foul or "gum up" the dicing saw. Further the b-staged underfill needs to adhere to the passivation layer of the chip during dicing. The diced chips now can be stored.

Figure 7:
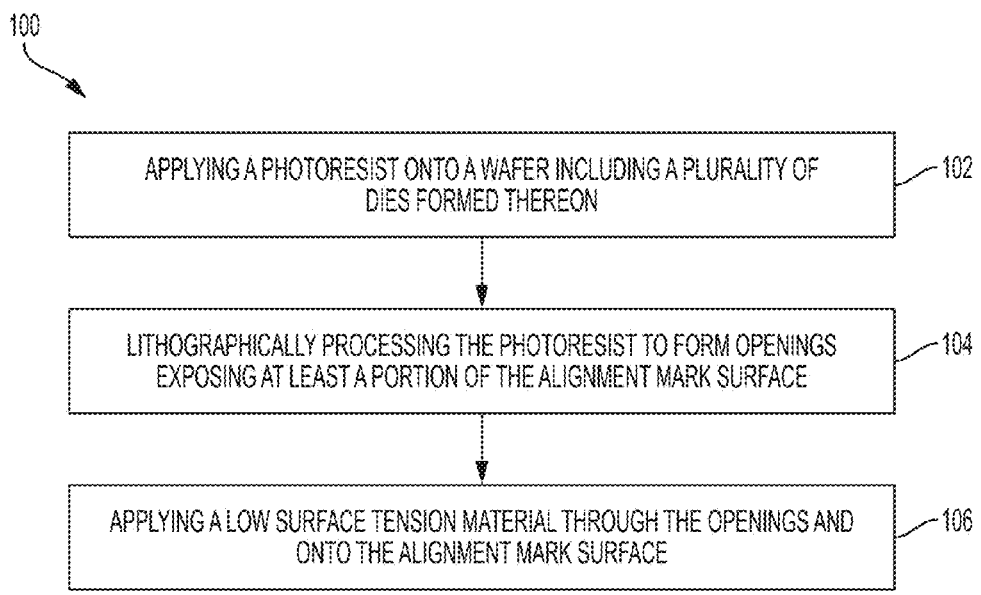
FIG. 7 is a flow diagram for selectively applying the low surface tension material to at least the portion of the alignment mark surface in accordance with an embodiment of the present invention.

In another embodiment, the process includes photolithography to precisely impart low surface tension surface to the alignment marks. In this process 100 as shown in FIG. 7, a photoresist is deposited onto the wafer including one more dies formed thereon as shown in step 102. The photoresist is lithographically patterned as in step 104 e.g., exposed to activating radiation through a mask and developed, wherein the mask includes openings corresponding to the alignment openings as in the case of a positive acting photoresist or covers the alignment marks in the case of a negative acting photoresist such that development of the photoresist after exposure exposes the alignment marks. A low surface tension material is then applied through the openings and onto the alignment mark surface as shown in step 106.

A self-assembling low surface tension material is then applied via spin coating, spraying, immersion, or the like onto the wafer. By way of example, a low surface tension material such as a solution of octadecyltrichlorosilane in toluene or a solution of polytetrafluoroethylene in a perfluorinated solvent can be applied. The wafer is then heated to form a stable coating, e.g., the polytetrafluoroethylene solution can be heated to about 310° C. to about 330° C. for a period of about 10 to 15 minutes to fix the coating.

It should be noted that in some embodiments the extreme corners of the die may not need the self-assembling low surface tension material since these areas generally need underfill protection (by structural coupling) more than other areas. In this manner, only a portion of the alignment marks are needed to provide alignment and effective bonding of the flip chip to the substrate. As such, the alignment marks may be in the center of the die, in the center and off center, or any other areas, which in some embodiments may include the corners. For alignment marks having dimensions less than about 1 micron, the use of photolithography to expose the alignment marks for subsequent coating with the low surface tension material may be preferred.

The underfill materials are then deposited as described above followed by die cutting. The underfill materials are not intended to be limited to any particular type and are generally polymer based materials that contain inorganic filler(s) to approximate the CTE of the solder joint as described above.

In an embodiment, the underfill material may comprise a thermally reversible material. "Thermally reversible", as used herein, means that the material may be repeatedly heated and cooled without substantially altering the inherent physical or chemical properties of the material, except that it becomes relatively less viscous as it is heated, and it becomes relatively more viscous as it is cooled.

Using a thermally reversible material in underfill may enable the electronic assembly to be reworked, by heating underfill material suitably for it to become less viscous again. The ability to rework electronic assemblies, such as electronic assembly, is an advantage, because it may decrease manufacturing costs.

A thermally reversible network polymer typically contains thermally reversible covalent crosslinks. At room temperature, the material is relatively solid and may have adhesion, CTE (coefficient of thermal expansion), dielectric, mechanical, and other properties similar to an epoxy thermoset underfill. At higher temperature, these crosslinks dissociate to yield a low-viscosity substance, and when it is subsequently cooled the substance readily polymerizes to regenerate the original solid network polymer.

Although, in an embodiment, a thermally reversible network polymer is used, in other embodiments a non-thermally reversible polymeric adhesive may be used, for example, if reworkability is not required.

As an alternative to a polymeric adhesive, the underfill material may comprise a thermoset plastic, an unlinkable epoxy, or other suitable material having properties similar to or identical to those described herein. Epoxy resins are of great importance for a number of diverse applications including coatings, adhesives, structural materials, electrical insulation, encapsulants etc. Epoxy formulations have outstanding properties after curing, including, but not limited to, toughness, adhesion and solvent resistance.

The flow characteristics of underfill material may be selected such that underfill material is not sticky (or relatively unsticky) at room temperature. Thus it may be used with known IC manufacturing equipment, such as pick-and-place equipment.

Inorganic filler is used to lower the overall coefficient of thermal expansion (CTE) of the polymer layer, and accordingly, of the underfill. The inorganic filler used in the present invention is non-conductive, and is inert, that is, it will not react with or destabilize the polymer layer. An amount of inorganic filler is used in the polymer layer in order to get the CTE of the underfill close to the relatively lower CTE of the solder joint. The proper choice of CTE is necessary for stress mitigation during manufacturing and subsequent use of the electronic assembly.

Fillers used in the formulation are present in an amount between about 5% and 75% by weight, preferably between about 30% and 65% by weight, and can be any of the powdered solids known in the art including alumina, silica, zinc oxide, boron nitride, talc, titanium oxide, zirconia, berylia, ceria, silicon nitride, aluminum nitride, and silicon carbide. Al, Ag, Cu, $TiO_2$, clay, and the like. Mixtures of inorganic filler may be used. The inorganic filler may have any suitable shape and size. Preferably, the inorganic filler has a spherical or substantially spherical shape. Such spherical shape minimizes surface area and allows for a higher loading of filler in the polymer region. It is preferred that the inorganic filler has a size, such as a particle size, that will not impede the penetration of the second polymer region by interconnect structures. It is preferred that the inorganic filler has a mean particle size of 0.005 to 10 microns (μm), more preferably from 0.01 to 5 μm, and yet more preferably 0.01 to 3 μm. The inorganic filler may optionally be treated with an adhesion promoter to modify the surface chemistry of the filler particle, for example, to allow the inorganic filler particle to react with the polymer or crosslinker used in the polymer region. Modifying the surface chemistry of the filler may improve fracture toughness and may improve the dispersion of the filler in the polymer region. All ranges disclosed herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context.

It will be understood that when an element is referred to as being "on" another element, it can be directly on the other element or intervening elements may be present therebetween. In contrast, when an element is referred to as being "directly on" another element, there are no intervening elements present.

It will also be understood that, although the terms first, second, third, etc. may be used herein to describe various elements, components, regions, layers, portions or sections, these elements, components, regions, layers, portions or sections should not be limited by these terms. These terms are only used to distinguish one element, component, region, layer or section from another element, component, region, layer, portion or section. Thus, a first element, component, region, layer, portion or section could be termed a second element, component, region, layer or section without departing from the teachings of the present invention.

Furthermore, relative terms, such as "lower" or "bottom" and "upper" or "top," may be used herein to describe one element's relationship to another element as may be illustrated in the Figures. It will be understood that relative terms are intended to encompass different orientations of the device in addition to the orientation depicted in the Figures. For example, if the device in one of the Figures is turned over, elements described as being on the "lower" side of other elements would then be oriented on "upper" sides of the other elements. The exemplary term "lower," can therefore, encompass both an orientation of "lower" and "upper," depending on the particular orientation of the Figure. Similarly, if the device in one of the Figures is turned over, elements described as "below" or "beneath" other elements would then be oriented "above" the other elements. The exemplary terms "below" or "beneath" can, therefore, encompass both an orientation of above and below.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A process for pre-applying an opaque or translucent underfill material prior to coupling a die to a substrate, comprising:
   selectively applying a low surface tension material of less than 35 dynes/cm to at least a portion of an alignment mark surface on a die; and
   applying the opaque or translucent underfill material to the die surface, wherein the underfill material does not wet or adhere to the low surface tension material such that the alignment mark surface is free of underfill material.

2. The process of claim 1, wherein selectively applying the low surface tension material to at least the portion of the alignment mark surface comprises contacting a wafer comprising one or more of the dies formed thereon with a metal mask including openings exposing the alignment mark surface; and applying the low surface tension material through the openings and onto the alignment mark surface.

3. The process of claim 2, wherein applying the low surface tension material through the openings and onto the alignment mark surface comprises depositing particles of the low surface tension material, and heating the die to a temperature effective to coalesce the particles to form a coating.

4. The process of claim 1, wherein selectively applying the low surface tension material to at least the portion of the alignment mark surface comprises applying a photoresist onto a wafer comprising one or more of the dies formed thereon; lithographically processing the photoresist to form openings exposing the alignment mark surface; and applying a low surface tension material through the openings and onto the alignment mark surface.

5. The process of claim 4, wherein applying the low surface tension material through the openings and onto the alignment mark surface comprises depositing a solution containing the low surface tension material.

6. The process of claim 1, wherein the low surface tension material is a fluorinated polymer.

7. The process of claim 1, further comprising dicing the wafer to form a plurality of dies with the pre-applied underfill material and coupling the dies to a substrate using a vision alignment system.

8. The process of claim 1, wherein the alignment mark surface on the die are located in a central region of the die.

9. The process of claim 1, wherein the alignment mark surface on the die are located in an off-central region of the die.

10. The process of claim 1, wherein the alignment mark surface on the die are located in one or more corners of the die.

11. The process of claim 1, wherein the pre-applied underfill material is an epoxy.

12. The process of claim 1, wherein the pre-applied underfill material is a thermally reversible material.

13. A pre-applied underfill die structure, comprising:
a wafer comprising a plurality of dies, wherein each one of the dies includes at least one alignment mark;
a transparent low surface tension material of less than 35 dynes/cm deposited onto at least a portion of the at least one alignment mark; and
a pre-applied underfill material deposited onto the wafer at a thickness approximating a height of the bumps on the dies so as to define the pre-applied underfill die structure.

14. The pre-applied underfill structure of claim 13, wherein the low surface tension material is a fluorinated polymer.

15. The pre-applied underfill structure of claim 13, wherein the low surface tension material is a self-assembled monolayer.

16. The pre-applied underfill structure of claim 13, wherein the at least one alignment mark is located in a central region of the die.

17. The pre-applied underfill structure of claim 13, wherein the at least one alignment mark is located in an off-central region of the die.

18. The pre-applied underfill structure of claim 13, wherein the at least one alignment mark is located in one or more corners of the die.

19. The pre-applied underfill structure of claim 13, wherein the pre-applied underfill material is an epoxy.

20. The pre-applied underfill structure of claim 13, wherein the pre-applied underfill material is a thermally reversible material.

21. A pre-applied underfill structure, comprising:
a wafer comprising a plurality of dies, wherein each one of the dies includes at least one alignment mark;
a transparent low surface tension material deposited onto at least a portion of the at least one alignment mark; and
a pre-applied underfill material deposited onto the wafer at a thickness approximating a height of the bumps on the dies, wherein the low surface tension material is selected to provide the pre-applied underfill material with a contact angle greater than 60 degrees, and wherein the at least portion of the at least one alignment mark including the transparent low surface tension material deposited thereon is free of the pre-applied underfill material.

* * * * *